United States Patent
Nam et al.

(10) Patent No.: US 10,170,190 B2
(45) Date of Patent: Jan. 1, 2019

(54) MEMORY CONTROLLER HAVING RECLAIM CONTROLLER AND METHOD OF CONTROLLING OPERATION OF THE MEMORY CONTROLLER

(71) Applicant: SAMSUNG ELECTRONICS CO., LTD., Suwon-si, Gyeonggi-Do (KR)

(72) Inventors: Sang-Wan Nam, Hwaseong-si (KR); Dae-Seok Byeon, Hwaseong-si (KR); Chi-Weon Yoon, Seoul (KR); Hae-Suk Shin, Uiwang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/676,778

(22) Filed: Aug. 14, 2017

(65) Prior Publication Data

US 2018/0150261 A1   May 31, 2018

(30) Foreign Application Priority Data

Nov. 25, 2016 (KR) ........................ 10-2016-0158497

(51) Int. Cl.
*G11C 16/06* (2006.01)
*G06F 3/06* (2006.01)

(52) U.S. Cl.
CPC ............ *G11C 16/06* (2013.01); *G06F 3/0604* (2013.01); *G06F 3/0659* (2013.01); *G06F 3/0679* (2013.01)

(58) Field of Classification Search
CPC ..... G06F 3/0659; G06F 3/0679; G06F 3/0604
See application file for complete search history.

(56) References Cited

U.S. PATENT DOCUMENTS

| | | | |
|---|---|---|---|
| 7,411,841 B2 | 8/2008 | Sakai | |
| 8,078,923 B2 | 12/2011 | Nagadomi et al. | |
| 8,154,924 B2 | 4/2012 | Park et al. | |
| 8,811,094 B2 | 8/2014 | Lee et al. | |
| 9,098,416 B2 | 4/2015 | Mataya et al. | |
| 9,141,534 B2 | 9/2015 | D'Abreu et al. | |
| 9,230,689 B2 | 1/2016 | Tuers et al. | |
| 9,304,905 B2 | 4/2016 | Kwon et al. | |
| 9,412,463 B1 | 8/2016 | Chen et al. | |
| 2008/0181018 A1* | 7/2008 | Nagadomi | G11C 16/3418 365/185.25 |
| 2013/0031443 A1* | 1/2013 | Oh | G11C 11/5628 714/773 |
| 2014/0355351 A1 | 12/2014 | Unno et al. | |
| 2015/0355845 A1 | 12/2015 | Lee et al. | |

FOREIGN PATENT DOCUMENTS

KR             101491829           2/2015

* cited by examiner

*Primary Examiner* — Ajay Ojha
(74) *Attorney, Agent, or Firm* — Volentine, Whitt & Francos, PLLC

(57) ABSTRACT

A method of controlling the operation of a memory controller includes, in a read operation of a non-volatile memory device, the memory controller counting a selected read count of a selected string in a selected memory block and/or counting a non-selected read count of a non-selected string in the selected memory block. The memory controller performs a reclaim operation of the selected memory block when the selected read count and/or the non-selected read count exceeds a read threshold. To move data of the selected memory block to another memory block by the reclaim operation, the memory controller may copy the data of the selected memory block to another block by using a changed page address.

20 Claims, 20 Drawing Sheets

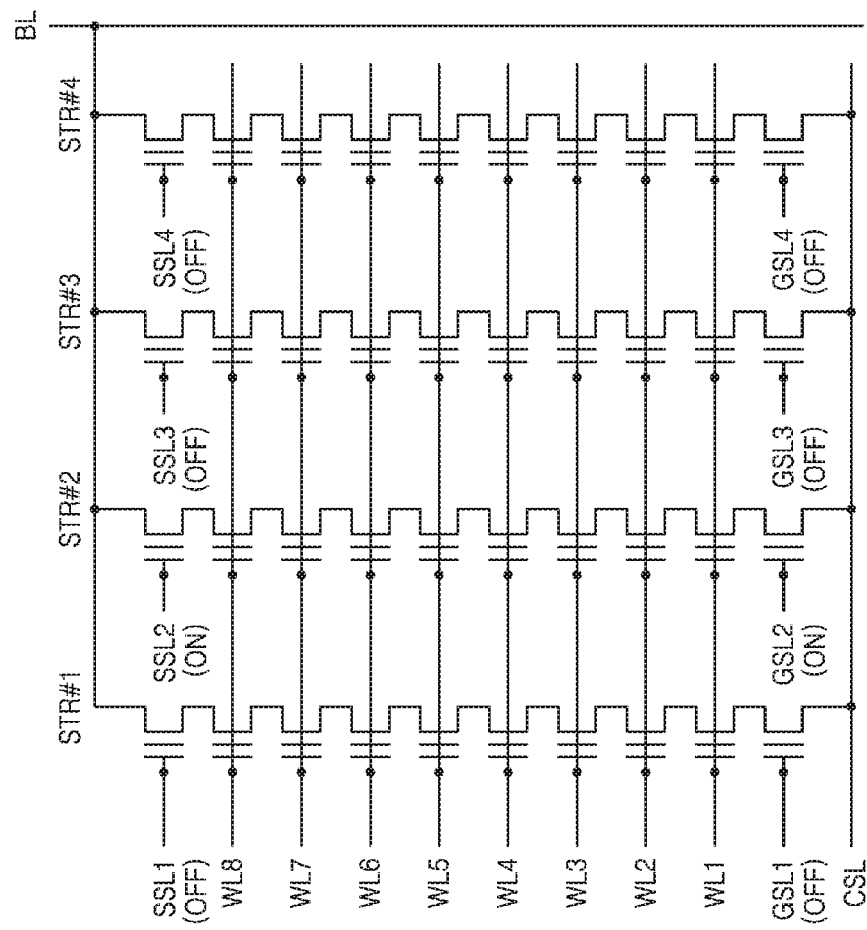

FIG. 7B

|  | Block Read Count | STR#1 | STR#2 | STR#3 | STR#4 |
|---|---|---|---|---|---|
| Case 'A' (Intense) | 100 | 0 | 100 | 0 | 0 |
| Case 'B' | 100 | 0 | 50 | 25 | 25 |
| Case 'C' (Random) | 100 | 25 | 25 | 25 | 25 |

-Selected String-

-Unselected String-

FIG. 9A

| | Block Read Count | STR#1 | STR#2 | STR#3 | STR#4 | Register |
|---|---|---|---|---|---|---|
| BLK#1 | A+B+C+D | A | B | C | D | Max. (A\|\|B\|\|C\|\|D\|\|) |
| BLK#2 | E+G | E | F | G | H | Max. (E\|\|G) |

FIG. 10

|  | Block Read Count | STR#1 | STR#2 | STR#3 | STR#4 | First Register (Sel_STR) | Second Register (Unsel_STR) |
|---|---|---|---|---|---|---|---|
| BLK#1 | SUM= A+B+C+D | A/ (SUM−A) | B/ (SUM−B) | C/ (SUM−C) | D/ (SUM−D) | Max. (A~D) | Max. (Sum−(A~D)) |
| BLK#2 | I+J+K+L | I | J | K | L | Max. (I~L) | |

Selected/Unselected Read Count

FIG. 11

|  | Block Read Count | STR#1 | STR#2 | STR#3 | STR#4 |
|---|---|---|---|---|---|
| Case'A' (Intense) | 100 | 0/100 | 100/0 | 0/100 | 0/100 |
| Case'B' | 100 | 0/100 | 50/50 | 25/75 | 25/75 |
| Case'C' (Random) | 100 | 25/75 | 25/75 | 25/75 | 25/75 |

Selected/Unselected Read Count

MEMORY CONTROLLER HAVING RECLAIM CONTROLLER AND METHOD OF CONTROLLING OPERATION OF THE MEMORY CONTROLLER

CROSS-REFERENCE TO RELATED APPLICATION

This non-provisional patent application claims priority under 35 U.S.C. § 119 to Korean Patent Application No. 10-2016-0158497, filed on Nov. 25, 2016 in the Korean Intellectual Property Office, the disclosure of which is incorporated herein in its entirety by reference.

BACKGROUND

1. Technical Field

The present disclosure relates to a memory device. More particularly, the present disclosure relates to a memory controller having a reclaim controller for controlling a read reclaim operation of a non-volatile memory device and a method of controlling the operation of the memory controller.

2. Discussion of Related Art

Semiconductor memory devices are generally classified into volatile memory devices, such as dynamic random access memory (DRAM) and static random access memory (SRAM), and non-volatile memory devices, such as electrically erasable and programmable read only memory (EEPROM), ferroelectric random access memory (FRAM), phase-change random access memory (PRAM), magnetic random access memory (MRAM), and a flash memory. The volatile memory device loses stored data when power is turned off, but the non-volatile memory device preserves stored data even when power is turned off. In particular, the flash memory has advantages such as high programming speed, low power consumption, and large data storage. Accordingly, a memory system including a flash memory is widely used as a data storage medium.

The memory system includes a memory controller for controlling the flash memory. The memory controller may perform various operations for managing the flash memory. If the memory controller can reduce the number of reclaim entries according to the read disturbance of the flash memory, the lifetime of the flash memory may be extended and performance of the memory system can be improved.

SUMMARY

The present disclosure provides a reclaim control method according to the read disturbance of a non-volatile memory device.

The present disclosure provides a memory controller for performing the reclaim control method.

According to an aspect of the inventive concepts of the present disclosure, a method of operating a memory controller for controlling a non-volatile memory device may include transmitting, by the memory controller, a read command and a read address to the non-volatile memory device. The method may also include performing a read operation on memory cells connected to a selected word line in a selected string of a selected memory block of the non-volatile memory device, according to the read command and the read address. The method may further include counting a selected read count of the selected string in the selected memory block; and performing a reclaim operation to move data, stored in the selected memory block, to another memory block based on the selected read count.

According to another aspect of the inventive concepts of the present disclosure, a method of operating a memory controller for controlling a non-volatile memory device may include counting a non-selected read count of a non-selected string in a selected memory block. The method may also include performing a reclaim operation to move data, stored in the selected memory block, to another memory block based on the non-selected read count.

According to another aspect of the inventive concepts of the present disclosure, a method of operating a memory controller for controlling a non-volatile memory device may include performing a reclaim operation by which data stored in memory cells connected to a selected word line in a selected string of a selected memory block is stored in memory cells connected to another word line other than a selected word line of another memory block.

According to another aspect of the inventive concepts of the present disclosure, a memory controller includes a read controller and a reclaim controller. The read controller may perform a read operation on memory cells connected to a selected word line in a selected string of a selected memory block of a non-volatile memory device, according to a read command and a read address transmitted to the non-volatile memory device. The read controller may also count a selected read count of the selected string in the selected memory block, and count a non-selected read count of a non-selected string in the selected memory block. The reclaim controller may perform a reclaim operation to move data, stored in the selected memory block, to another memory block when any one of the selected read count and the non-selected read count exceeds a read threshold.

BRIEF DESCRIPTION OF THE DRAWINGS

Embodiments of the present disclosure will be more clearly understood from the following detailed description taken in conjunction with the accompanying drawings in which:

FIGS. 7A and 7B are a circuit diagram and a table diagram, respectively, illustrating a shared bit line structure according to an embodiment of the present disclosure;

FIGS. 9A and 9B are diagrams illustrating a first example for explaining a reclaim control operation of a block having a shared bit line structure according to an embodiment of the present disclosure;

FIG. 10 is a diagram illustrating an example of a read count table of a block having a shared bit line structure according to an embodiment of the present disclosure;

FIG. 11 is a diagram illustrating the control of a reclaim operation based on a non-selected read count according to an embodiment of the present disclosure;

DETAILED DESCRIPTION OF THE EMBODIMENTS

Hereinafter, embodiments of the present disclosure will be described in detail with reference to the accompanying drawings. It should be understood that the inventive concepts of the present disclosure may be embodied in different ways without departing from the spirit and scope of the inventive concepts of the present disclosure. Therefore, it should be understood that the following embodiments are provided for illustration only and are not to be construed in any way as limiting the inventive concepts of the present disclosure. Initially, several concepts described herein are introduced below as an introduction of concepts in the present disclosure.

As described herein, a reclaim operation is an operation to reclaim memory such as a selected memory block. The reclaim operation may be performed by, for example, copying original data stored in a selected memory block to another memory block in order to free up ("reclaim") the storage capacity in the selected memory block.

As also described herein, a selected read count is a number of reads of a selected string in a selected memory block. A non-selected read count is a number of non-selected reads of a non-selected string in the selected memory block. Non-selected reads are reads that are performed on a non-selected string even though the non-selected string is not selected for a read.

As further described herein, a read disturbance may be caused when a read operation is performed on a charge trap flash (CTF) memory cell in a memory block due to Fowler Nordheim (FN) stress, such as in the direction of a cell gate electrode (GE) to the channel of a pillar (P). The read disturbance may be caused by a high read voltage applied to non-selected cells while reading a selected cell. Since the read disturbance occurs in a cell connected to a non-selected word line rather than a selected word line, cell deterioration may be estimated by the number of reads of the non-selected cells or may be estimated by counting the number of read operations (i.e., a read count) performed in one block, in addition to a read request requested by the host.

Alternatively, and also as described herein, a "main" read disturbance may be caused when a read operation is performed even when FN stress is relatively reduced due to a channel of a non-selected string being floated and boosted by a read voltage. However, due to a boosting charge, hot carrier injection (HCI) defects may occur in cells adjacent to a string edge or a selected cell. In the non-selected strings HCI stress may act as the main read disturbance. In a shared bit line structure, a read disturbance phenomenon is different between a selected string and a non-selected string, and thus, a reclaim method that might be applied for the FN stress cannot be applied equally to the selected string and the non-selected string.

Figure 1:
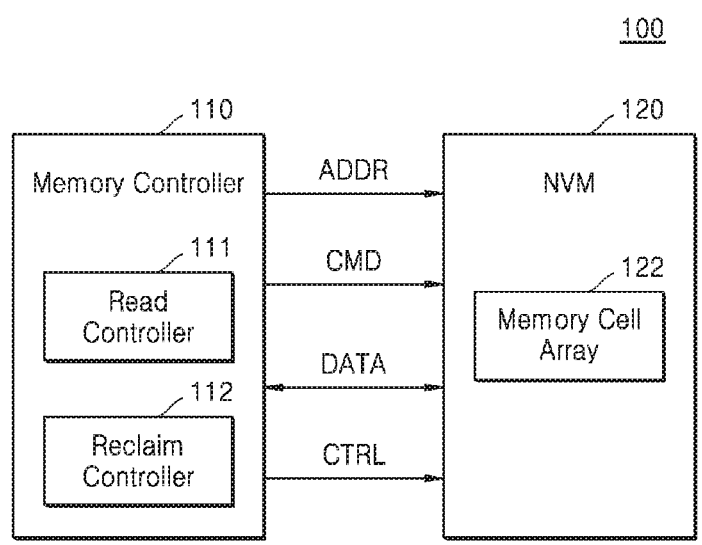
FIG. 1 is a block diagram of a memory system according to embodiments of the present disclosure.

FIG. 1 is a block diagram of a memory system 100 according to embodiments of the present disclosure.

Referring to FIG. 1, the memory system 100 may include a memory controller 110 and a non-volatile memory device 120. The memory system 100 may be connected to, or a component of, a host such as a computer, a notebook computer, a smart phone, a smart pad, a smart TV, and a netbook. The memory system 100 may be accessed in conjunction with one or more application operations under one or more operating systems in the host. The memory system 100 may execute read/write operations or other memory access operations in response to requests of the host.

The memory controller 110 may write data DATA to the non-volatile memory device 120 or read the data DATA stored in the non-volatile memory device 120. The non-volatile memory device 120 may include non-volatile memory elements such as NAND flash memory, NOR flash memory, phase-change random access memory (PRAM), resistance RAM (ReRAM), and magnetic RAM (MRAM). Hereinafter, the inventive concepts of the present disclosure will be described on the assumption that the non-volatile memory device 120 includes NAND flash memory. For example, it is assumed that the non-volatile memory device 120 includes charge trap flash (CTF) memory.

The memory controller 110 may transmit a command CMD, an address ADDR, a control signal CTRL, and the data DATA to the non-volatile memory device 120 so as to write the data DATA to the non-volatile memory device 120. The memory controller 110 may transmit the command CMD, the address ADDR, and the control signal CTRL to the non-volatile memory device 120 so as to read the data DATA stored in the non-volatile memory device 120.

The non-volatile memory device 120 may perform data write, read, and erase operations in response to signals received from the memory controller 110. The non-volatile memory device 120 may include a memory cell array 122 having memory cells arranged in rows (word lines) and columns (bit lines). Each of the memory cells may store 1-bit data (a single-bit) or M-bit data (multiple bits, where M is an integer equal to or greater than 2). Each of the memory cells may be implemented as a memory cell having a charge storage layer such as a floating gate or a charge trapping layer, a memory cell having a variable resistor, or the like.

The memory cell array 122 may have a single-layer array structure (a two-dimensional (2D) array structure) or a multi-layer array structure (a three-dimensional (3D) array structure). A 3D memory array may be formed in a monolithic manner in an active area on a silicon substrate, at a physical level of at least one of memory cell arrays having circuits formed on the substrate or in the substrate for operations of memory cells. The term "monolithic" means that layers of each level of the 3D memory array are stacked directly on layers of a lower level of the 3D memory array.

In an embodiment according to the present disclosure, the 3D memory array may include NAND strings disposed in a vertical direction so that at least one memory cell is located on another memory cell. The at least one memory cell may include a charge trapping layer. U.S. Pat. Nos. 7,679,133; 8,553,466; 8,654,587; and 8,559,235, and U.S. Patent Application Publication No. 2011-0233648 are incorporated by reference in their entireties, and disclose appropriate configurations of a 3D memory array including multiple levels and word lines and/or bit lines shared between levels. Also, U.S. Patent Application Publication No. 2014-0334232 and U.S. Pat. No. 8,488,381 are incorporated by reference in their entireties.

The memory controller 110 may include a read controller 111 and a reclaim controller 112. The read controller 111 may control the memory cell array 122 of the non-volatile memory device 120 to perform a read operation. The read controller 111 may transmit a read command and a read address to the non-volatile memory device 120, and may perform a read operation on memory cells connected to a selected word line in a selected string of a selected memory block of the non-volatile memory device 110, according to the read command and the read address. The read controller 111 may count a selected read count (i.e., the number of reads) of a selected string in a selected memory block or count a non-selected read count (i.e., the number of non-selected reads) of a non-selected string.

Whenever a string is selected in a selected memory block, the reclaim controller 112 may update a selected read count of the selected string in a latch corresponding to the selected string. Alternatively, whenever a string is not selected, the reclaim controller 112 may update a non-selected read count of the non-selected string.

When the highest of selected read counts and/or non-selected read counts of individual strings in a selected memory block exceeds a read threshold, the reclaim controller 112 may perform a reclaim operation of the selected memory block. The reclaim controller 112 may copy original data stored in a selected memory block to another memory block by using a changed page address, according to the degree of dispersion of selected read counts of individual strings in the selected memory block.

Figure 2:
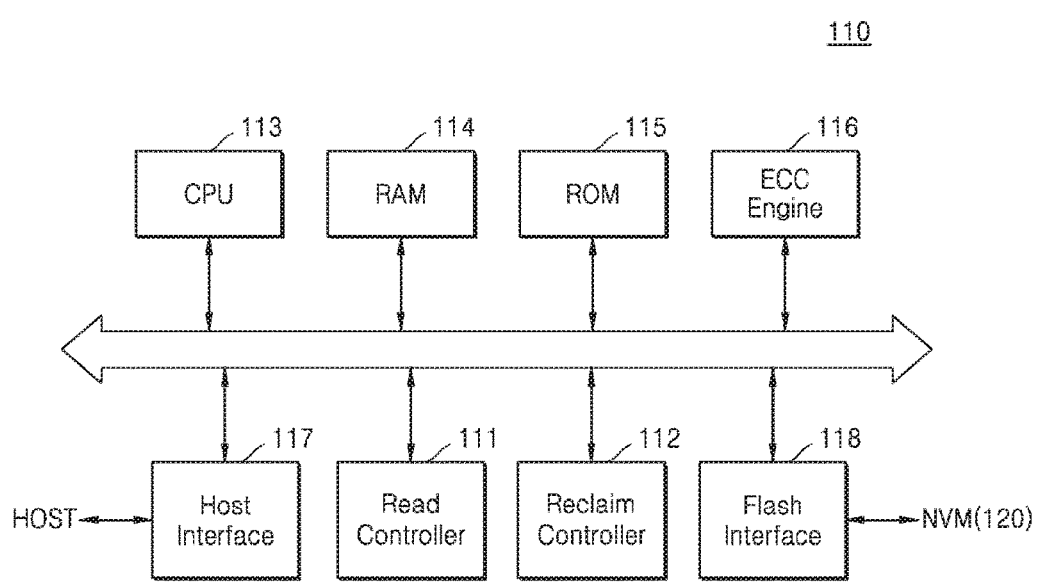
FIG. 2 is a block diagram illustrating a memory controller of FIG. 1.

FIG. 2 is a block diagram of the memory controller 110 of FIG. 1.

Referring to FIG. 2, the memory controller 110 may include a read controller 111, a reclaim controller 112, a central processing unit (CPU) 113, an RAM 114, an ROM 115, an error correction code (ECC) engine 116, a host interface 117, and a flash interface 118.

The read controller 111 may count a selected read count of a selected string in a memory block selected in a read operation of the non-volatile memory device 120 and count a non-selected read count of a non-selected string.

When any one of selected read counts and non-selected read counts of individual strings in a selected memory block exceeds a read threshold, the reclaim controller 112 may perform a reclaim operation to move data stored in the selected memory block to another memory block. The reclaim controller 112 may change a page address when copying data of a selected memory block to another memory block, according to the deviation of a selected read count of a string causing a reclaim operation, and copy the data to the other memory block by using the changed page address.

The CPU 113 may control general operations of the memory controller 110.

The RAM 114 may operate according to the control of the CPU 113 and may be used as a cache memory, a buffer memory, an operation memory, etc. of the memory controller 110. When the RAM 114 is used as a work memory, data processed by the CPU 113 may be temporarily stored. When the RAM 114 is used as the buffer memory, data that is to be transmitted from a host HOST to the non-volatile memory device 120 of FIG. 1 or from the non-volatile memory device 120 to the host HOST may be buffered. When the RAM 114 is used as the cache memory, the non-volatile memory device 120 may operate at high speed.

The ROM 115 may store various types of information required to operate the memory controller 110 in a firmware manner. For example, the CPU 113 may read the firmware stored in the ROM 115 and drive the read firmware.

For example, the reclaim controller 112 may be implemented as firmware, may be stored in a part of the ROM 115 or the non-volatile memory device 120, and may be driven by the CPU 113. Alternatively, the reclaim controller 112 may be implemented as a software layer, may be stored in the RAM 114, and may be driven by the CPU 113.

The ECC engine 116 may detect and correct an error of data read from the non-volatile memory device 120. For example, the ECC engine 116 may correct the error by using parity. The ECC engine 116 may correct the error of the data read by using coded modulation such as a low density parity check (LDPC) code, a BCH code, a turbo code, a convolution code, etc.

The memory controller 110 may communicate with the host HOST through the host interface 117. For example, the host interface 117 may include various interfaces such as a Universal Serial Bus (USB), a MultiMedia Card (MMC), peripheral component interconnect express (PCI-E), advanced technology attachment (ATA), serial ATA (SATA), parallel ATA (PATA), a serial attached small computer system (SAS), a small computer system interface (SCSI), an embedded MMC (eMMC), an enhanced small disk interface (ESDI), and the like.

The memory controller 110 may communicate with the non-volatile memory device 120 through the flash interface 118. For example, the flash interface 118 may be configured to support a NAND flash memory, a multi-level flash memory, and a single-level flash memory.

Figure 3:
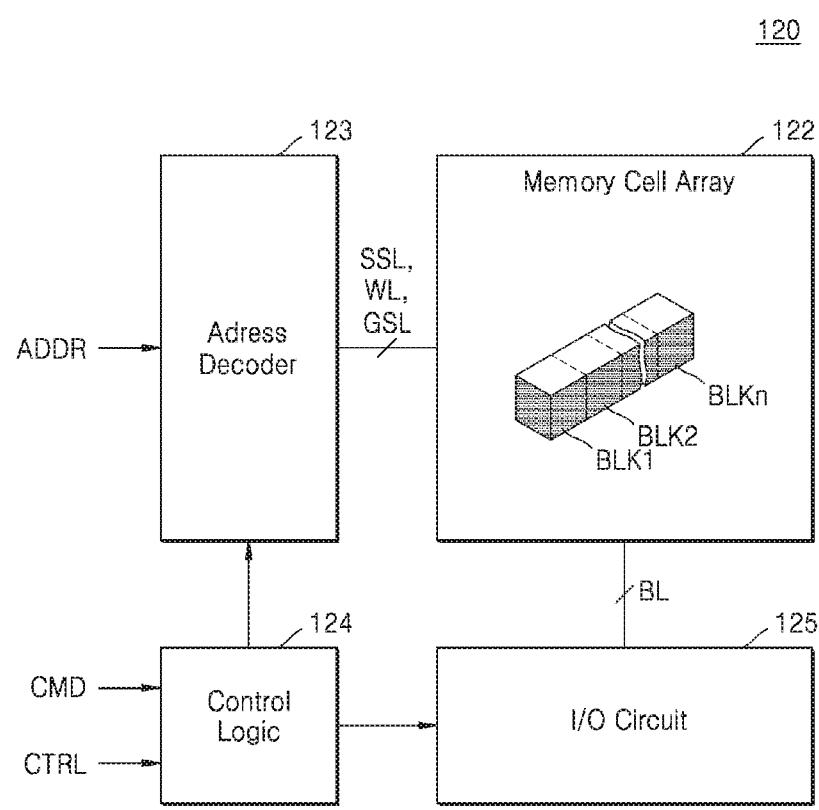
FIG. 3 is a block diagram illustrating a non-volatile memory device of FIG. 1.

FIG. 3 is a block diagram of the non-volatile memory device 120 of FIG. 1.

Referring to FIG. 3, the non-volatile memory device 120 may include the memory cell array 122, an address decoder 123, a control logic 124, and an input/output (I/O) circuit 125.

The memory cell array 122 may be connected to word lines WL, string selection lines SSL, ground selection lines GSL, and bit lines BL. The memory cell array 122 may be connected to the address decoder 123 through the word lines WL, the string selection lines SSL, and the ground selection lines GSL, and to the I/O circuit 125 through the bit lines BL. The memory cell array 122 may include multiple memory blocks BLK1 to BLKn.

Each of the memory blocks BLK1 to BLKn may include multiple memory cells and multiple selection transistors. The memory cells may be connected to the word lines WLs. The selection transistors may be connected to the string selection lines SSLs or the ground selection lines GSLs. The memory cells of each of the memory blocks BLK1 to BLKn may be formed as single-level cells which store 1-bit data or as multi-level cells which store multi-bit data. The memory cells of each of the memory blocks BLK1 to BLKn may form a 3D structure by being stacked in a direction perpendicular to a substrate. A structure of a memory block will be described in detail with reference to FIGS. 4 and 5.

The address decoder 123 may perform selection and driving operations on the word lines WL of the memory cell array 122. The address decoder 123 may receive the address ADDR from the memory controller 110, may decode the received address ADDR, and may drive the multiple word lines WL.

The control logic 124 may receive the command CMD and the control signal CTRL from the memory controller 110 and may control the address decoder 123 and the I/O circuit 125 in response to received signals. For example, the control logic 124 may control the address decoder 123 and the I/O circuit 125 to write the data DATA to the memory cell array 122 in response to the command CMD and the control signal CTRL. The control logic 124 may control the address decoder 123 and the I/O circuit 125 to output the data DATA stored in the memory cell array 122 in response to the command CMD and the control signal CTRL. The control logic 124 may control the address decoder 123 and the I/O circuit 125 to erase a part of the memory cell array 122 in response to the command CMD and the control signal CTRL.

The control logic 124 may control a voltage generator that generates various voltages required to operate the nonvolatile memory device 120. For example, the voltage generator may generate various voltages such as multiple selection read voltages, multiple non-selection read voltages, multiple programming voltages, multiple pass voltages, and multiple erase voltages and provide the generated voltages to the address decoder 123.

The I/O circuit 125 may be connected to the memory cell array 122 through the multiple bit lines BL. The I/O circuit 125 may control the multiple bit lines BL so that the data DATA received from the memory controller 110 is written to the memory cell array 122. The I/O circuit 125 may control the multiple bit lines BL so that the data DATA stored in the memory cell array 122 is output.

Figure 4:
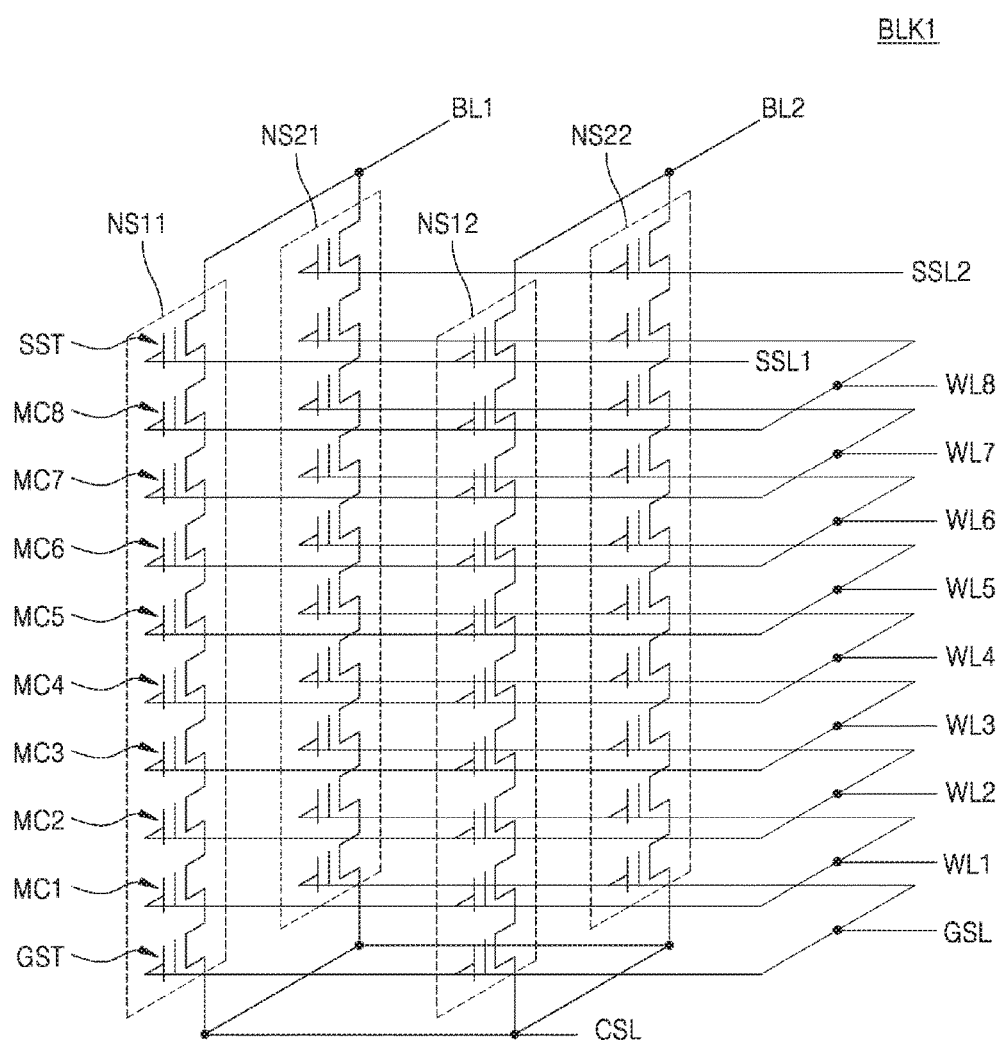
FIG. 4 is a circuit diagram illustrating an example of a memory cell array of FIG. 3.

FIG. 4 is a circuit diagram illustrating an example of the memory cell array 122 of FIG. 3. A part of the first memory block BLK1 among the memory blocks BLK1 to BLKn described with reference to FIG. 3 is described but the first memory block BLK1 and memory blocks generally described herein are not limited thereto. The other memory blocks BLK2 to BLKn may have the same structure as the first memory block BLK1.

The first memory block BLK1 may include multiple NAND strings NS11 to NS22, multiple word lines WL1 to WL8, multiple bit lines BL1 and BL2, a ground selection line GSL, a string selection line SSL, and a common source line CSL. The string selection line SSL may be divided into first and second string selection lines SSL1 and SSL2. In this regard, the number of the NAND strings, the number of the word lines, the number of the bit lines, the number of the ground selection lines, and the number of the string selection lines may be variously changed according to embodiments.

The NAND strings NS11 and NS21 may be provided between the first bit line BL1 and the common source line CSL. The NAND strings NS12 and NS22 may be provided between the second bit line BL2 and the common source line CSL. Each NAND string (e.g., NS11) may include a string selection transistor SST, multiple memory cells MC1 to MC8, and a ground selection transistor GST, which are connected in series.

NAND strings commonly connected to a single bit line may constitute a single column. For example, the NAND strings NS11 and NS21 commonly connected to the first bit line BL1 may correspond to a first column. The NAND strings NS12 and NS22 commonly connected to the second bit line BL2 may correspond to a second column.

NAND strings commonly connected to a single string selection line may constitute a single row. For example, the NAND strings NS11 and NS12 commonly connected to the first string selection line SSL1 may correspond to a first row. The NAND strings NS21 and NS22 commonly connected to the second string selection line SSL2 may correspond to a second row.

The string selection transistor SST may be connected to the corresponding string selection lines SSL1 and SSL2. The multiple memory cells MC1 to MC8 may be connected to the corresponding word lines WL1 to WL8, respectively. The ground selection transistor GST may be connected to the corresponding ground selection line GSL, and to the common source line CSL. The ground selection transistor GST may be connected to the common source line CSL.

In the present embodiment, word lines (e.g., WL1) having the same height may be commonly connected to each other. For example, when memory cells connected to a first word line WL1 and included in the NAND strings NS11 and NS12 are programmed, the first word line WL1 and the first string selection line SSL1 may be selected.

The number of columns of the NAND strings may increase or decrease. As the number of columns of the NAND strings changes, the number of the bit lines connected to columns of the NAND strings and the number of the NAND strings connected to one string selection line may also change.

Height of the NAND strings may increase or decrease. For example, the number of memory cells stacked on each of the NAND strings may increase or decrease. As the number of memory cells stacked on each of the NAND strings changes, the number of the word lines may also change. For example, the number of string selection transistors or ground selection transistors provided to each of the NAND strings may increase. As the number of string selection transistors or ground selection transistors provided to each of the NAND strings changes, the number of string selection lines or ground selection lines may also change. If the number of string selection transistors or ground selection transistors increases, string selection transistors or ground selection transistors may be stacked in the form of the memory cells MC1 to MC8.

For example, programming and read operations may be performed in a row unit of the NAND strings NS11, NS12, NS21, and NS22. The NAND strings NS11, NS12, NS21, and NS22 may be selected in a single row unit by the string selection lines SSL1 and SSL2. The NAND strings NS11 and NS12 may be selected in a single row unit by the first string selection line SSL1. The NAND strings NS21 and NS22 may be selected in a single row unit by the second string selection line SSL2.

The programming and read operations may be performed in a page unit in selected rows of the NAND strings NS11, NS12, NS21, and NS22. A page may be a single row of memory cells connected to a single word line. The memory cells may be selected in the page unit by the word lines WL1 to WL8 in the selected rows of the NAND strings NS11, NS12, NS21, and NS22.

Figure 5:
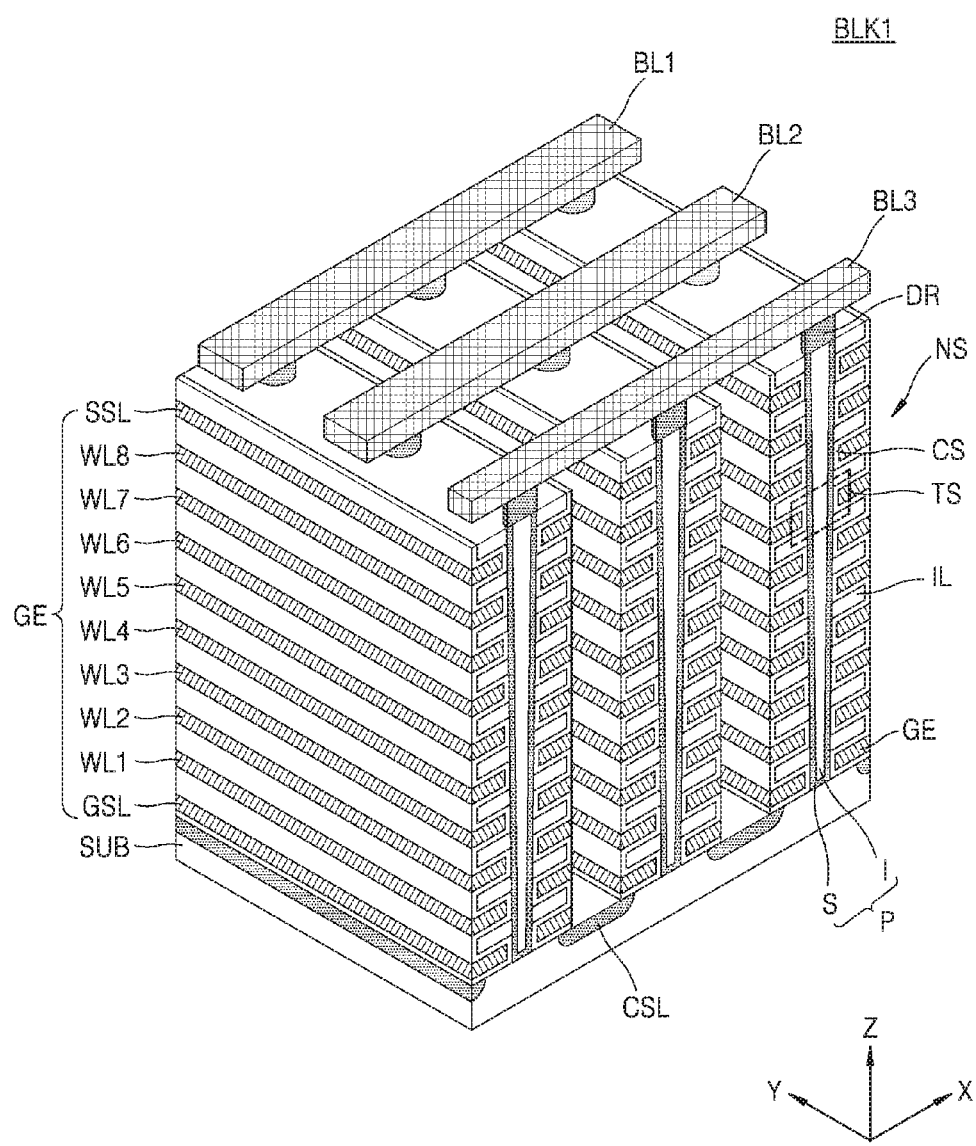
FIG. 5 is a perspective view illustrating a structure corresponding to a memory block of FIG. 4.

FIG. 5 is a perspective view illustrating a structure corresponding to the memory block BLK1 of FIG. 4.

Referring to FIG. 5, the memory block BLK1 may be formed in a direction perpendicular to a substrate SUB. In FIG. 5, although the memory block BLK1 is illustrated to include two selection lines GSL and SSL, eight word lines WL1 to WL8, and three bit lines BL1 to BL3, the memory block BLK1 may actually include more or less lines.

A common source line CSL extends along a first direction (e.g., a Y direction), and is doped with impurities having a second conductive type (e.g., an N type). The common source line CSL may be provided on the substrate SUB that has a first conductive type (e.g., a P type). Multiple insulating layers IL which extend along the first direction may be sequentially provided on an area of the substrate SUB between two adjacent common source lines CSL along a third direction (e.g., a Z direction) and may be spaced from each other by a predetermined distance along the third direction. For example, the multiple insulating layers IL may include an insulating material such as silicon oxide.

Multiple pillars P which are sequentially disposed along the first direction and pass through the multiple insulating layers IL in the third direction may each be provided on the area of the substrate SUB between two adjacent common source lines CSL. For example, the multiple pillars P may pass through the multiple insulating layers IL to come into contact with the substrate SUB. More specifically, a surface layer S of each of the pillars P may include a silicon material having a p-type and serve as a channel area. Meanwhile, an inner layer I of each of the pillars P may include an insulating material such as silicon oxide or an air gap.

In the area between the two adjacent common source lines CSL, a charge storage layer CS may be provided along exposed surfaces of the insulating layers IL, the pillars P, and the substrate SUB. The charge storage layer CS may include a gate insulating layer (which may also be referred to as 'a tunnel insulating layer'), a charge trapping layer, and a blocking insulating layer. For example, the charge storage layer CS may have an oxide-nitride-oxide (ONO) structure. In the area between the two adjacent common source lines CSLs, gate electrodes GE such as the selection lines GSL and SSL and the word lines WL1 to WL8 may be provided on an exposed surface of the charge storage layer CS.

Drains or drain contacts DR may be respectively provided on the multiple pillars P. For example, the drains or the drain contacts DR may include a silicon material doped with impurities having the second conductive type. The bit lines BL1 to BL3 which extend in the second direction (e.g., an X direction) and are spaced from each other by a predetermined distance along the first direction may be provided on the drain contacts DR.

Each of the pillars P may form a NAND string NS along with the insulating layer(s) IL and the selection lines GSL and SSL and the word lines WL1 to WL8 that extend in the third direction. The NAND string NS may include multiple transistor structures TS. Each of the transistor structures TS may be formed as a charge trap flash (CTF) memory cell.

When a read operation is performed, a CTF memory cell of the memory block BLK1 may cause a read disturbance due to Fowler Nordheim (FN) stress in the direction of a cell gate electrode GE and the channel of the pillar P. The read disturbance may be caused by a high read voltage VREAD applied to the remaining non-selected cells while reading a selected cell. Since the read disturbance occurs in a cell connected to a non-selected word line rather than a selected word line, cell deterioration may be estimated by the number of reads of the non-selected cells or may be estimated by counting the number of read operations (i.e., a read count) performed in one block. Of course, cell deterioration also occurs in selected cells in a selected word line based on a read request is requested by the host for the selected cells/word line(s).

Figure 6A:
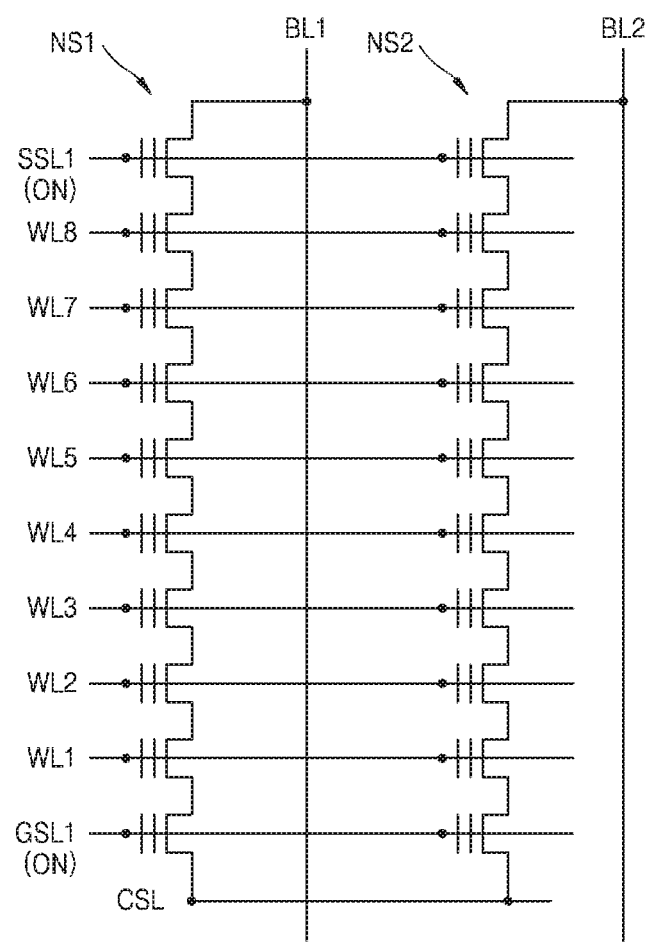
FIGS. 6A and 6B are diagrams illustrating a reclaim method for a block having a one-bit line/one-string structure according to an embodiment of the present disclosure.
Figure 6B:
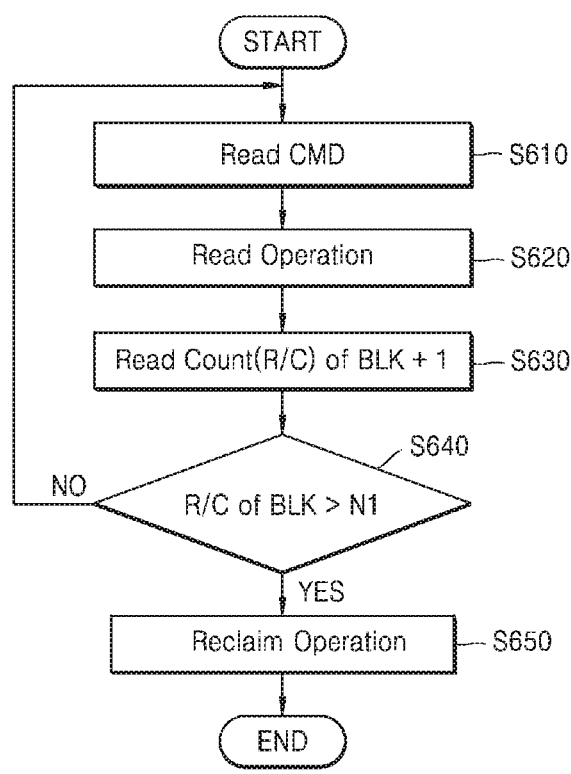

FIGS. 6A and 6B are diagrams illustrating a reclaim method for a block having a one-bit line/one-string structure according to an embodiment of the present disclosure. FIG. 6A is a circuit diagram of a block having a one-bit line/one-string structure. FIG. 6B is a flowchart showing a reclaim method performed in the block having a one-bit line/one-string structure.

Referring to FIG. 6A, each of the multiple bit lines BL1 and BL2 is connected to one string selection line SSL1. One block including the multiple bit lines BL1 and BL2 is selected by the string selection line SSL1, and thus, the structure of the block may be referred to as an 1SSL plane structure. In a block having the 1SSL plane structure, when a read operation is performed, a bit line bias may be applied to all the strings NS1 and NS2 and thus FN stress may be caused. Accordingly, a read count per block may mean the number of times FN stress of cells occurs, whether the FN stress is actually monitored and detected, or the FN stress is assumed to occur.

Referring to FIG. 6B, the memory controller 110 of FIG. 1 receives a read command (Operation S610) and performs a read operation of a corresponding block according to the read command (Operation S620). A read count of the corresponding block increases by +1 each time the read operation is performed on the corresponding block (Operation S630), and if the read count exceeds a read threshold N1 (Operation S640), a reclaim operation is performed on the corresponding block (Operation S650). The reclaim operation may be an operation of moving data of a (presumably) deteriorated source block to a destination block.

FIGS. 7A and 7B are a circuit diagram and a table diagram, respectively, illustrating a shared bit line structure according to an embodiment of the present disclosure.

Referring to FIG. 7A, a one-bit line/multi-string structure includes four string selection lines SSL1, SSL2, SSL3, and SSL4 connected to one bit line BL. A block having such a shared bit line structure will be referred to as a block with a 4SSL plane structure.

In FIG. 7A, it is assumed that a second NAND string STR#2 is selected and a read operation is performed. Channels of non-selected NAND strings STR#1, STR#3, and STR#4 are floated as string selection transistors SST connected to string selection lines SSL1, SSL3, and SSL4, and ground selection transistors GST connected to ground selection lines GSL1, GSL3, and GSL4 are turned off.

In the channels of the non-selected NAND strings STR#1, STR#3, and STR#4, FN stress will act in the direction of the cell gate electrode GE (refer to FIG. 5) to the channels, due to boosting by a read voltage VREAD applied to non-selected word lines. In this case, FN stress in the channels of the non-selected NAND strings STR#1, STR#3, and STR#4 will still be significantly less than FN stress in the selected string STR#2, but will nevertheless be significant over time.

FIG. 7B shows three cases, i.e., first to third cases Case 'A', Case 'B', and Case 'C', in which one hundred (100) read operations have been performed on a block having the 4SSL plane structure of FIG. 7A.

As an example, it is assumed that the first case Case 'A' is a case in which a read operation is intensively performed one hundred (100) times only on cells of the second NAND string STR#2. It is assumed that the second case Case 'B' is a case in which a read operation is performed 50 times on cells of the second NAND string STR#2 and performed 25 times on cells of each of the third and fourth NAND strings STR#3 and STR#4. It is assumed that the third case Case 'C' is a case in which a read operation is performed 25 times on cells of each of the first to fourth NAND strings STR#1, STR#2, STR#3, and STR#4. Hereinafter, for convenience of explanation, the NAND string is collectively referred to as a string. Furthermore, the real threshold N1 may be assumed to be one hundred (100), and it is assumed that a read count exceeding the read threshold N1 will result in a reclaim operation being performed.

In all of the first to third cases Case 'A', Case 'B', and Case 'C', a total block read count is one hundred (100) times. If the reclaim method of FIG. 6B is used, a reclaim operation (refer to Operation S650) is to be performed in all of the first to third cases Case 'A', Case 'B', and Case 'C' when a read count exceeds the read threshold N1. However, a reclaim operation may be required only in the first case Case 'A'. In the second and third cases Case 'B' and Case 'C', there may be a margin for FN stress to perform a reclaim operation.

For example, assuming that a read operation is uniformly performed on each of the strings NS1 to NS4, a read count for a block having the 4SSL plane structure shown in FIG. 7A may be a number obtained by multiplying the number (4) of SSL planes by a read threshold value (100). In other words, read counts of 400 times may be allowed.

Accordingly, a block having the shared bit line structure needs to perform a read reclaim operation for each string plane. In the shared bit line structure, a read disturbance phenomenon is different between a selected string and a non-selected string, and thus, the reclaim method of FIG. 6B cannot be applied equally to the selected string and the non-selected string.

Figure 8A:
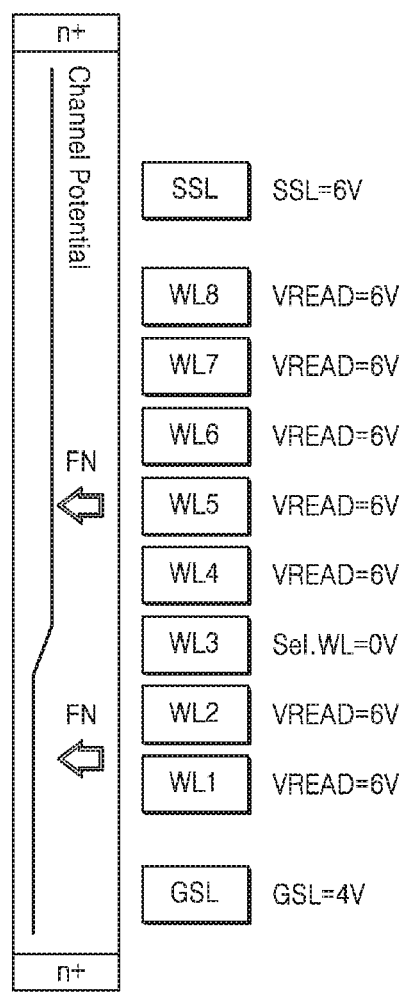
FIGS. 8A and 8B are diagrams illustrating a read disturbance phenomenon in the shared bit line structure of FIG. 7A.
Figure 8B:
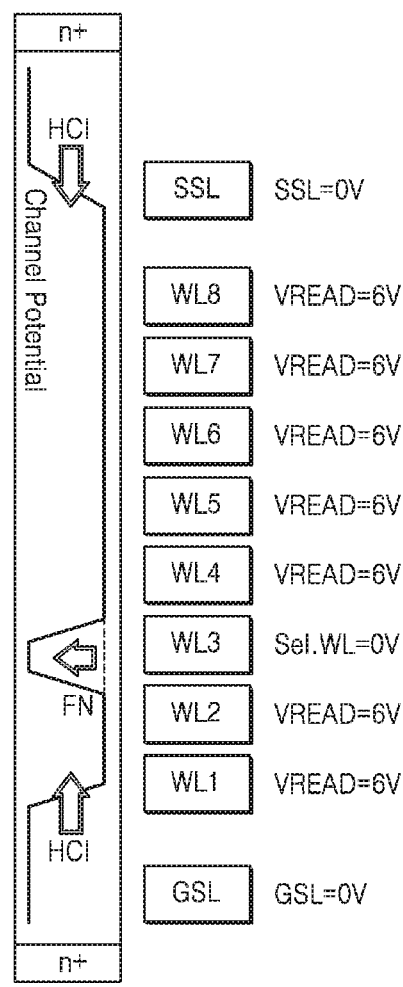

FIGS. 8A and 8B are diagrams illustrating a read disturbance phenomenon in the shared bit line structure of FIG. 7A. For convenience of explanation, a case in which a third word line WL3 is selected in the shared bit line structure of FIG. 7A will be described.

Referring to FIG. 8A, in the selected string STR#2, a selection read voltage Vr, e.g., 0V, is applied to the selected third word line WL3 and a read voltage VREAD, e.g., 6V, is applied to non-selected first, second, and fourth word lines WL1, WL2, and WL4. A string selection voltage equal to the read voltage VREAD is applied to the selected string selection line SSL2 and a voltage, e.g., 4V, lower than the read voltage VREAD is applied to the selected ground selection line GSL2. In the selected string STR#2, FN stress in the direction from a cell gate to a channel acts as a main read disturbance.

Referring to FIG. 8B, also in the non-selected strings STR#1, STR#3, and STR#4, the selection read voltage of 0 V is applied to the selected third word line WL3 and the read voltage of 6V is applied to the non-selected first, second, and fourth word lines WL1, WL2, and WL4. Then, 0V is applied to non-selected string selection lines SSL1, SSL3, and SSL4 and non-selected ground selection lines GSL1, GSL3, and GSL4.

Since the channel of a non-selected string is floated and is boosted by the read voltage VREAD, FN stress may be relatively reduced. However, due to a boosting charge, hot carrier injection (HCI) defects may occur in cells adjacent to a string edge or a selected cell. In the non-selected strings STR#1, STR#3, and STR#4, HCI stress acts as a main read disturbance.

As described in FIGS. 6A to 8B, a block having a shared bit line structure needs to be managed so that a read reclaim operation is performed for each string plane or a reclaim operation is performed in consideration of an HCI disturbance in a non-selected string.

Figure 9B:
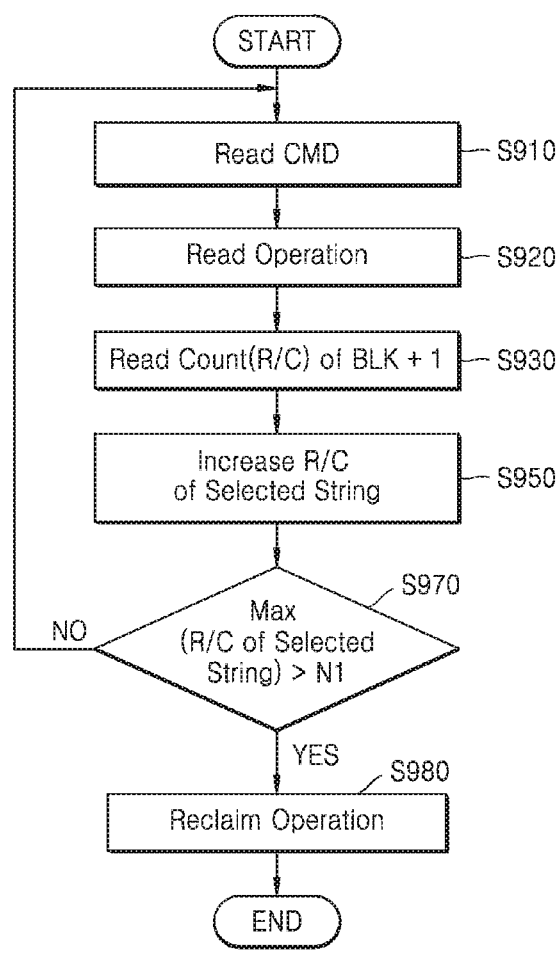

FIGS. 9A and 9B are diagrams of a first example for explaining a reclaim control operation of a block having a shared bit line structure according to an embodiment of the present disclosure. FIG. 9A illustrates a first example of a read count table 900 managed according to a read operation for each block, and FIG. 9B is a flowchart illustrating a reclaim control operation associated with the read count table 900 of FIG. 9A.

Referring to FIG. 9A in conjunction with FIG. 7A, the read count table 900 includes values obtained by counting read counts applied to individual strings. The read count table 900 may be managed in the memory controller 110. The memory controller 110 may update the read count table 900 every time it performs a read operation.

As an example, first and second blocks BLK#1 and BLK#2 each may have four strings STR#1, STR#2, STR#3, and STR#4 in which one bit line is shared by four string selection lines SSL.

In the first block BLK#1, a read count of the string STR#1, a read count of the string STR#2, a read count of the string STR#3, and a read count of the string STR#4 may be counted as A, B, C and D, respectively. A read count of each of the strings STR#1, STR#2, STR#3, and STR#4 may be counted each time a string selection transistor SST is turned on by a string selection line connected to each of the strings STR#1, STR#2, STR#3, and STR#4. The read counts A, B, C, and D may be stored in latches corresponding to the strings STR#1, STR#2, STR#3, and STR#4, respectively.

The memory controller 110 may select the largest value from among the read counts of the strings STR#1, STR#2, STR#3, and STR#4 of the first block BLK#1 and store the selected largest value in a register. The memory controller 110 may control the first block BLK#1 so that a reclaim operation for the first block BLK#1 is performed when a value stored in the register exceeds the read threshold N1. The memory controller 110 conventionally performs a reclaim operation based on a read count A+B+C+D of the first block BLK#1, whereas the memory controller 110 may increase a read count by applying the read threshold N1 to each of the strings STR#1, STR#2, STR#3, and STR#4. Accordingly, the number of read reclaims may be reduced.

In the second block BLK#2, the read count of the string STR#1, the read count of the string STR#2, the read count of the string STR#3, and the read count of the string STR#4 may be counted as E, F, G, and H. For example, it is assumed that data stored in the first and third strings STR#1 and STR#3 is original data and data stored in the second and fourth strings STR#2 and STR#4 is backup data.

The memory controller 110 may adopt only the read counts of the first and third strings STR#1 and STR#3 and disregard the read counts of the second and fourth strings STR#2 and STR#4. According to an embodiment, the read counts of the second and fourth strings STR#2 and STR#4 may not be counted. Accordingly, a read count of the second block BLK#2 is E+G.

The memory controller 110 may select the largest value from among the read counts of the first and third strings STR#1 and STR#3 of the second block BLK#2 and store the selected largest value in a register. The memory controller 110 may control the second block BLK#2 so that a reclaim operation for the second block BLK#2 is performed when a value stored in the register exceeds the read threshold N1.

According to an embodiment, the read count of each of the strings STR#1, STR#2, STR#3, and STR#4, shown in the read count table 900, may be counted in units of individual ground selection lines (GSLs) instead of individual string selection line (SSL) planes. That is, the read count of each of the strings STR#1, STR#2, STR#3, and STR#4 may be counted each time a ground selection transistor GST is turned on by a ground selection line connected to the strings STR#1, STR#2, STR#3, and STR#4.

According to an embodiment, a weight may be applied to the read count of each of the strings STR#1, STR#2, STR#3, and STR#4 in accordance with information about the selected blocks BLK#1 and BLK#2. The information about the selected blocks BLK#1 and BLK#2 contains contents stored in the selected blocks BLK#1 and BLK#2, reliability levels of the selected blocks BLK#1 and BLK#2, multi-level levels of memory cells in the selected blocks BLK#1 and BLK#2, the number of program/erase (P/E) times of the selected blocks BLK#1 and BLK#2, or a time during which read operations of the selected blocks BLK#1 and BLK#2 are performed.

The reclaim control operation of FIG. 9B may be performed by the memory controller 110. FIG. The memory controller 110 may receive a read command from a host (Operation S910) and may perform a read operation on the non-volatile memory device 120 according to the read command (Operation S920). In operation S920, it is assumed that a block on which a read operation is performed is the first block BLK#1. The memory controller 110 may increase the read count of the first block BLK#1 by one (Operation S930).

The memory controller 110 may count a read count of a string selected from among the strings STR#1, STR#2, STR#3, and STR#4 in a read operation of the first block BLK#1 and increase a selected read count of the selected string (Operation S950). The memory controller 110 may apply a weight to the read count of the selected string according to the information about the first block BLK#1.

The memory controller 110 may determine whether the largest value among selected read counts of the strings STR#1, STR#2, STR#3, and STR#4 exceeds the read threshold N1 (Operation S970). The determination may be performed only for the selected string when, for example, it is assumed that other strings are checked previously in a similar way when they were selected.

If it is determined in operation S970 that the largest value exceeds the read threshold value N1, the memory controller 110 may perform a reclaim operation on the first block BLK#1 (Operation S980). If it is determined in operation S970 that the largest value does not exceed the read threshold N1, the memory controller 110 may return to operation S910 and repeat a reclaim control operation.

According to an alternative embodiment, in an operation alternative to operation S970, the memory controller 110 may sum up the selected read counts of the strings STR#1, STR#2, STR#3, and STR#4 and in operation S980 perform a reclaim operation if a summed result value exceeds a read threshold.

FIG. 10 is a diagram illustrating an example of a read count table 1000 of a block having a shared bit line structure according to an embodiment of the present disclosure.

Referring to FIG. 10, the read count table 1000 shows a selected read count and a non-selected read count. The selected read count is the number of times an individual SSL plane has been selected. The non-selected read count is the number of times an individual SSL plane has not been selected. The selected read count and the non-selected read count are updated each time a read operation is performed on a block.

In a first block BLK#1, a selected read count of a string STR#1, a selected read count of a string STR#2, a selected read count of a string STR#3, and a selected read count of a string STR#4 may be counted as A, B, C and D, respectively, and the total read count of the first block BLK#1 may be A+B+C+D (SUM). A non-selected read count of each of the strings STR#1, STR#2, STR#3, and STR#4 may be determined to be a value obtained by subtracting a corresponding selected read count A, B, C, or D from the total read count SUM.

As examples, a non-selected read count of the string STR#1 may be represented by (SUM-A). A non-selected read count of the string STR#2 may be represented by (SUM-B). A non-selected read count of the string STR#3 may be represented by (SUM-C). A non-selected read count of the string STR#4 may be represented by (SUM-D).

In an embodiment, the non-selected read count of each of the strings STR#1, STR#2, STR#3, and STR#4 may be determined to be a non-selected read count of a corresponding non-selected string each time the strings STR#1, STR#2, STR#3, and STR#4 are not selected in a read operation of the first block BLK#1, instead of a value obtained by subtracting a corresponding selected read count A, B, C, or D from the total read count SUM.

The memory controller 110 may select the largest value among the selected read counts A, B, C and D of the strings STR#1, STR#2, STR#3, and STR#4 of the first block BLK#1 and store the largest value in a first register. The memory controller 110 may select the largest value among the non-selected read counts (SUM-A), (SUM-B), (SUM-C), and (SUM-D) of the strings STR#1, STR#2, STR#3, and STR#4 of the first block BLK#1 and store the selected largest value in a second register. The memory controller 110 may control the first block BLK#1 so that a reclaim operation for the first block BLK#1 is performed when a value stored in the second register exceeds the read threshold N1.

In the second block BLK#2, selected read counts of the strings STR#1, STR#2, STR#3, and STR#4 may be counted as I, J, K, and L, respectively. In this case, a read count of the second block BLK#2 may be I+J+K+L.

The memory controller 110 may select the largest value among the selected read counts I, J, K, and L of the strings STR#1, STR#2, STR#3, and STR#4 of the second block BLK#2 and store the selected largest value in a first register. The memory controller 110 may control the second block BLK#2 so that a reclaim operation for the second block BLK#2 is performed when a value stored in the first register exceeds the read threshold N1.

The memory controller 110 may determine whether to control (e.g., initiate or fully perform) a reclaim operation based on the non-selected read counts of the strings STR#1, STR#2, STR#3, and STR#4 or based on the selected read counts of the strings STR#1, STR#2, STR#3, and STR#4, by using the read count table 1000. The memory controller 110 may control a reclaim operation based on a non-selected read count or a selected read count, in accordance with information about a corresponding block. The information about a corresponding block may be, for example, stored contents, a reliability level, multi-level levels of cells, the number of program/erase (P/E) times, or a time during which a read operation is performed.

According to an embodiment, when a reclaim operation is controlled based on the selected read counts of the strings STR#1, STR#2, STR#3, and STR#4, the memory controller 110 may apply a weight to a selected read count in accordance with information about a corresponding block.

According to an embodiment, when a reclaim operation is controlled based on the non-selected read counts of the strings STR#1, STR#2, STR#3, and STR#4, the memory controller 110 may apply a weight to a non-selected read count in accordance with information about a corresponding block.

According to an embodiment, when a reclaim operation is controlled based on the non-selected read counts of the strings STR#1, STR#2, STR#3, and STR#4, the memory controller 110 may apply a weight to a non-selected read count in accordance with the position of a selected word line in a non-selected string. For example, a weight may be applied to a non-selected read count as a selected word line is closer to an edge word line, and a weight may not be applied to the non-selected read count when a selected word line is located in the center of a string.

FIG. 11 is a diagram illustrating the control of a reclaim operation based on a non-selected read count according to an embodiment of the present disclosure. FIG. 11 illustrates an example in which a non-selected read count is applied to a block in which 100 read operations have been performed as previously described with reference to FIG. 7B.

Referring to FIG. 11, a first case CASE 'A' is a case in which a read operation is intensively performed 100 times only on cells of a second string STR#2. In the first case CASE 'A', selected read counts of first, third, and fourth strings STR#1, STR#3, and STR#4 are zero and non-selected read counts thereof are 100. In the first case CASE 'A', when the maximum value 100 of the selected read counts or the maximum value 100 of the non-selected read counts exceeds the read threshold N1, a reclaim operation may be performed.

In a second case CASE 'B', the selected read count of the first string STR#1 is zero and the non-selected read count thereof is 100. The selected read count of the second string STR#2 is 50 and the non-selected read count thereof is 50. The selected read counts of the third and fourth strings STR#3 and STR#4 are 25, and the non-selected read counts thereof are 75. In the second case CASE 'B', when the maximum value 100 of the non-selected read counts exceeds the read threshold N1, a reclaim operation may be performed even though the maximum value 50 of the selected read counts is less than the read threshold N1.

In a third case CASE 'C', the selected read counts of the first to fourth strings STR#1 to STR#4 are 25 and the non-selected read counts thereof are 75. In the third case CASE 'C', a reclaim operation need not yet be performed since both the maximum value 50 of the selected read counts and the maximum value 75 of the non-selected read counts are less than the read threshold N1. The third case CASE 'C' may prevent a reclaim operation to be performed according to the block read count as described, for example, with reference to FIG. 6B. That is, by controlling a reclaim operation based on a non-selected read count, the number of reclaim operations may be reduced.

Figure 12:
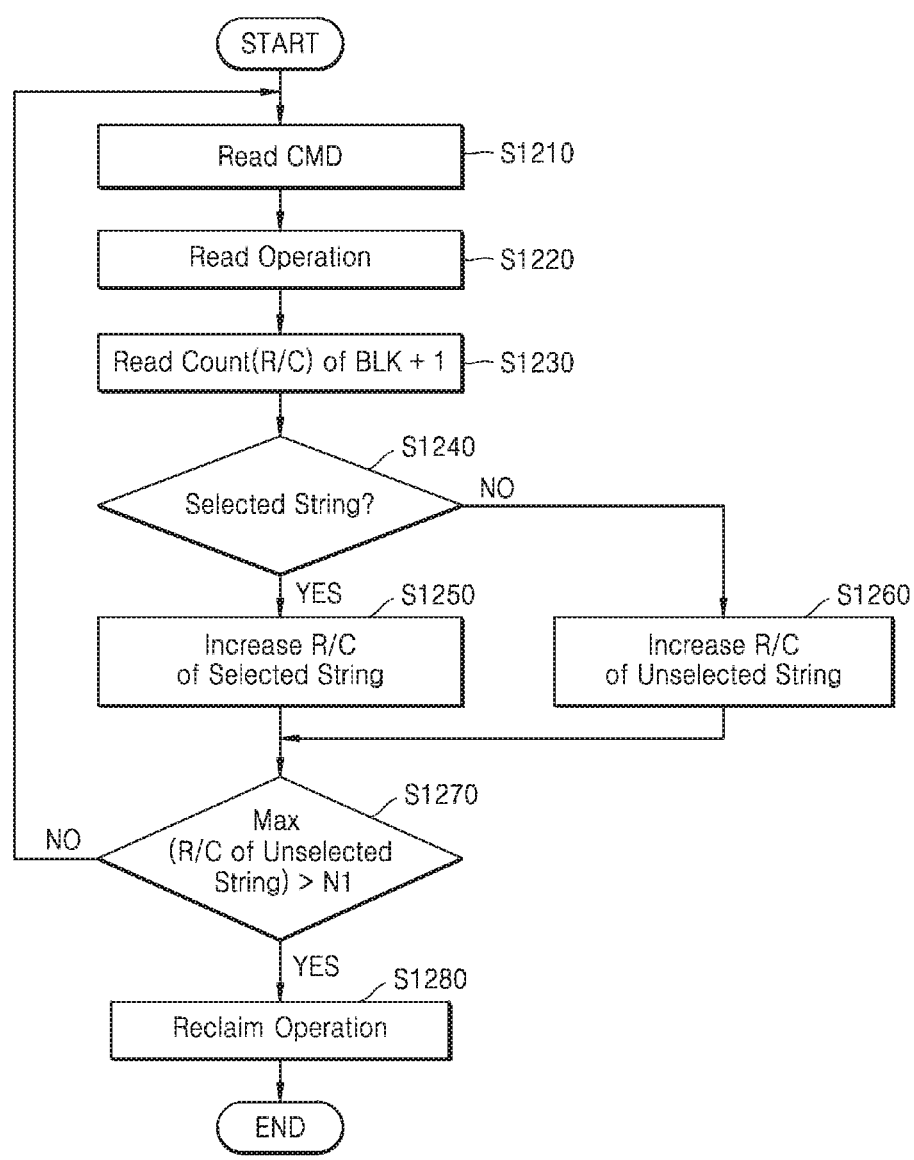
FIGS. 12 and 13 are flowcharts illustrating a reclaim control operation according to embodiments of the present disclosure.
Figure 13:
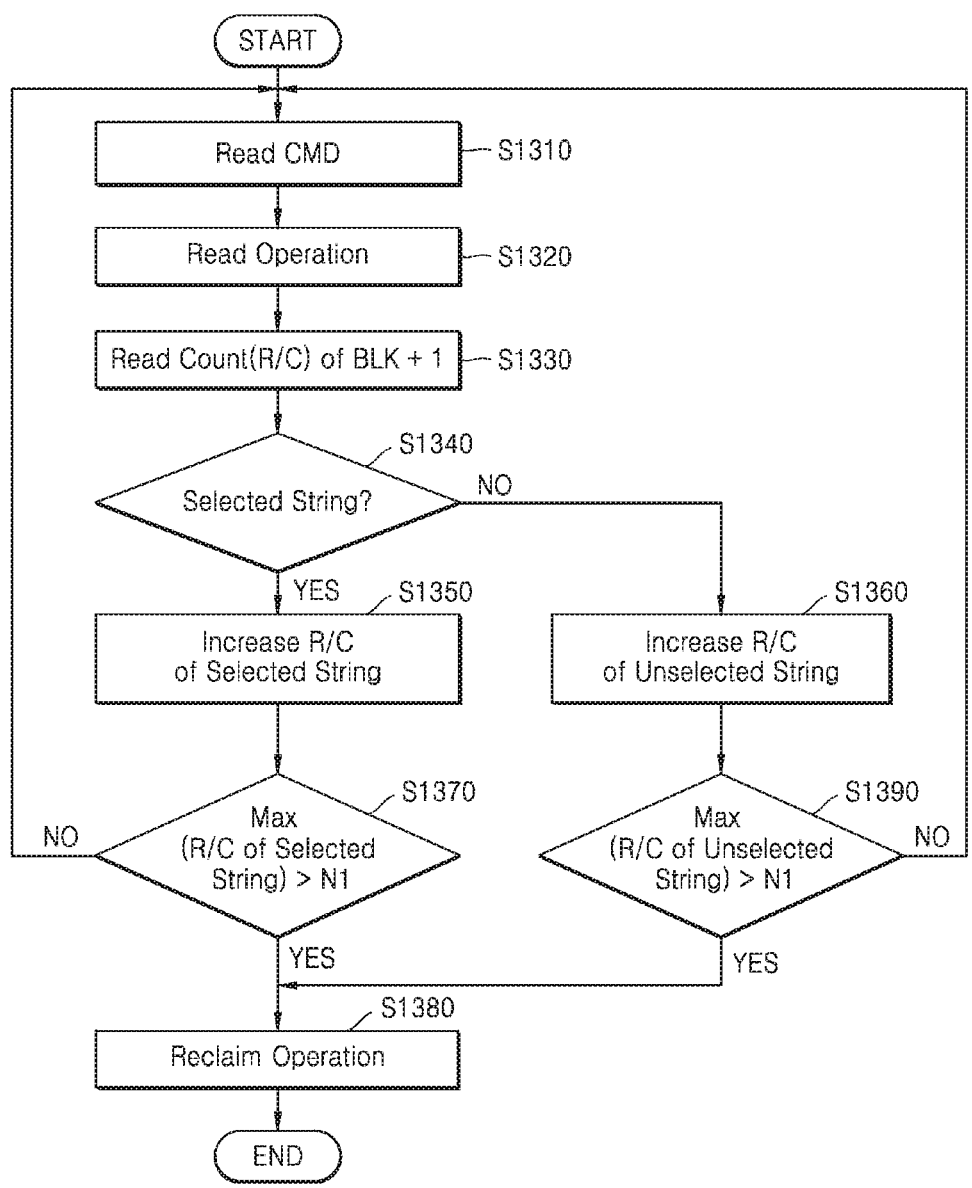

FIGS. 12 and 13 are flowcharts illustrating a reclaim control operation according to embodiments of the present disclosure.

Referring to FIG. 12 in conjunction with FIG. 10, the memory controller 110 may receive a read command from a host (Operation S1210) and may perform a read operation on the non-volatile memory device 120 according to the read command (Operation S1220). The memory controller 110 may increase a read count of a selected block (e.g., the first block BLK#1) on which a read operation is performed (Operation S1230).

The memory controller 110 determines whether a corresponding string is a selected string with respect to the strings STR#1, STR#2, STR#3, and STR#4 of the first block BLK#1 (Operation S1240).

If it is determined in operation S1240 that the corresponding string is a selected string (S1240=Yes), a selected read count may be increased by incrementally updating the read-count of the corresponding string (Operation S1250). As a result of the determination in operation S1240, if the corresponding string is not a selected string (S1240=No), a non-selected read count of the corresponding string may be incrementally increased (Operation S1260).

According to an embodiment, the memory controller 110 may count the non-selected read count of the corresponding string by subtracting the selected read count of the corresponding string of operation S1250 from the read count of the selected block of operation S1230.

The memory controller 110 may determine whether the largest value among non-selected read counts of the strings STR#1, STR#2, STR#3, and STR#4, counted in operation S1260, exceeds the read threshold N1 (Operation S1270).

If it is determined in operation S1270 that the largest value exceeds the read threshold value N1 (S1270=Yes), the memory controller 110 may perform a reclaim operation on the first block BLK#1 (Operation S1280). If it is determined in operation S1270 that the largest value does not exceed the read threshold value N1 (S1270=No), the memory controller 110 may return to operation S1210 and repeat a reclaim control operation.

Referring to FIG. 13 in conjunction with FIG. 10, the memory controller 110 may receive a read command from a host (Operation S1310) and perform a read operation on the non-volatile memory device 120 according to the read command (Operation S1320). The memory controller may incrementally increase (i.e., by one) a read count of a selected block on which a read operation is performed (Operation S1330). The selected block may be, for example, the first block BLK#1.

The memory controller 110 may determine whether a corresponding string is a selected string with respect to the strings STR#1, STR#2, STR#3, and STR#4 of the first block BLK#1 (Operation S1340).

If it is determined in operation S1340 that the corresponding string is a selected string (S1340=Yes), the selected read count of the corresponding string may be increased (Operation S1350). If it is determined in operation S1340 that the corresponding string is not a selected string (S1340=No), the non-selected read count of the corresponding string may be increased (Operation S1360).

The memory controller 110 may determine whether the largest value among the selected read counts of the strings STR#1, STR#2, STR#3, and STR#4, counted in operation S1350, exceeds the read threshold N1 (Operation S1370).

If it is determined in operation S1370 that the largest value exceeds the read threshold value N1 (S1370=Yes), the memory controller 110 may perform a reclaim operation on the first block BLK#1 (Operation S1380). If it is determined in operation S1370 that the largest value does not exceed the read threshold N1 (S1370=No), the memory controller 110 may return to operation S1310 and repeat the process in FIG. 13.

The memory controller 110 may determine whether the largest value among the non-selected read counts of the strings STR#1, STR#2, STR#3, and STR#4, counted in operation S1360, exceeds the read threshold N1 (Operation S1390).

If it is determined in operation S1390 that the largest value exceeds the read threshold N1 (S1390=Yes), the memory controller 110 may perform a reclaim operation on the first block BLK#1 (Operation S1380). If it is determined in operation S1390 that the largest value does not exceed the read threshold N1 (S1390=No), the memory controller 110 may return to operation S1310 and repeat the process in FIG. 13.

Figure 14A:
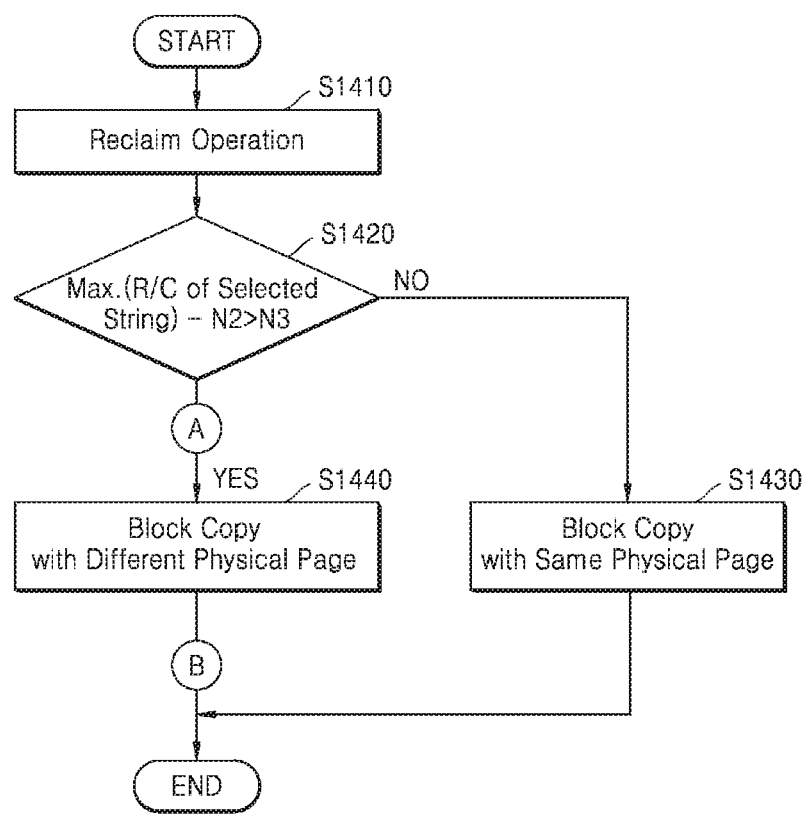
FIGS. 14A and 14B are flowcharts illustrating a reclaim operation according to embodiments of the present disclosure.
Figure 14B:
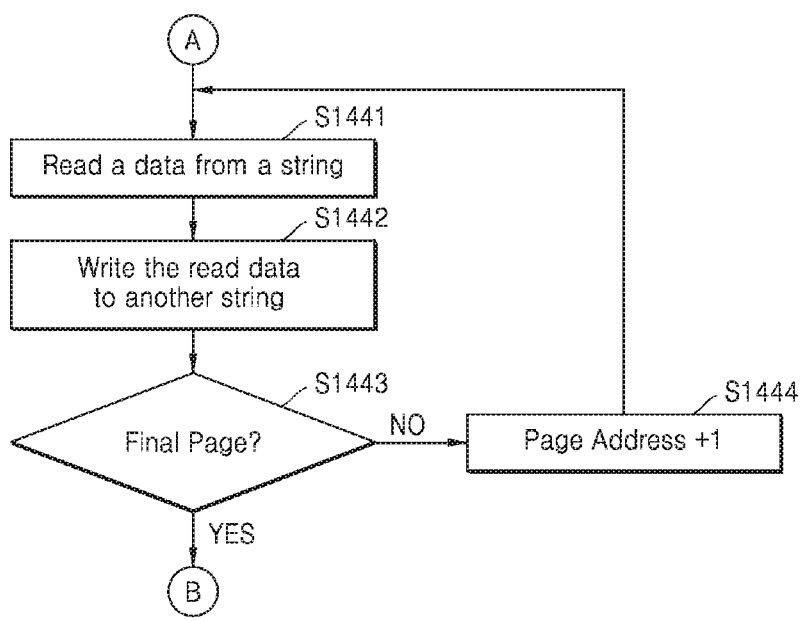

FIGS. 14A and 14B are flowcharts illustrating a reclaim operation according to embodiments of the present disclosure.

Referring to FIG. 14A in conjunction with FIG. 7A, the memory controller 110 may perform a reclaim operation (Operation S980, S1280, or S1380) for a deteriorated first block BLK#1 described with reference to FIGS. 9B, 12, and 13 (Operation S1410). The reclaiming operation may be an operation of copying data of the deteriorated first block (BLK#1) to a block other than the first block BLK#1.

The memory controller 110 may perform a reclaim operation in consideration of deviation between a selected read count of a string causing a reclaim operation of the first block BLK#1 and a selected read count of another string in the first block BLK#1. As an example, the selected read count of a string causing a reclaim operation may be the largest of the selected read counts of the strings STR#1, STR#2, STR#3, and STR#4. The memory controller 110 may change a page address when moving the data of the first block BLK#1 to another memory block, according to the severity of the deviation of a string causing a reclaim operation, and may move the data of the first block BLK#1 to another memory block at the changed page address.

The memory controller 110 may determine whether a difference between the largest value and the smallest value N2 among the selected read counts of the strings STR#1, STR#2, STR#3, and STR#4 exceeds a deviation allowance value N3 (Operation S1420).

According to another embodiment, in operation S1420, the memory controller 110 may determine whether a difference between the largest value among the selected read counts of the strings STR#1, STR#2, STR#3, and STR#4 and an average value N2 of the selected read counts of the strings STR#1, STR#2, STR#3, and STR#4 exceeds a deviation allowance value N3.

As a result of the determination in operation S1420, if the difference does not exceed the deviation allowance value N3 (S1420=No), the memory controller 110 may copy data of the first block BLK#1 to another block by using the same page address when moving the data of the first block BLK#1 to another block (Operation S1430). Accordingly, data stored in memory cells connected to a selected word line in a selected string of the first block BLK#1 may be stored in memory cells connected to a selected word line of the other block.

As a result of the determination in operation S1420, if the difference exceeds the deviation allowance value N3 (S1420=Yes), the memory controller 110 may copy the data of the first block BLK#1 to another block by using a changed page address when moving the data of the first block BLK#1 to another block (Operation S1440). Accordingly, the data stored in the memory cells connected to the selected word line in the selected string of the first block BLK#1 may be stored in memory cells connected to a word line other than the selected word line of the other block.

Referring to FIG. 14B, with respect to operation S1440 of FIG. 14A, data of the selected string of the first block BLK#1 may be read (Operation S1441) and the read data of the selected string may be stored in a selected string of another block or stored in another string (Operation S1442). Operation S1442 is followed by operation S1443.

In operation S1443, the memory controller 110 may determine whether or not the copying of all the pages of the first block BLK is completed. As a result of the determination in operation S1443, if the copying is completed, a reclaim operation ends. As a result of the determination in operation S1443, if the copying is not completed, the memory controller 110 may return to operation S1441 and repeat the process of FIG. 14B.

Figure 15:
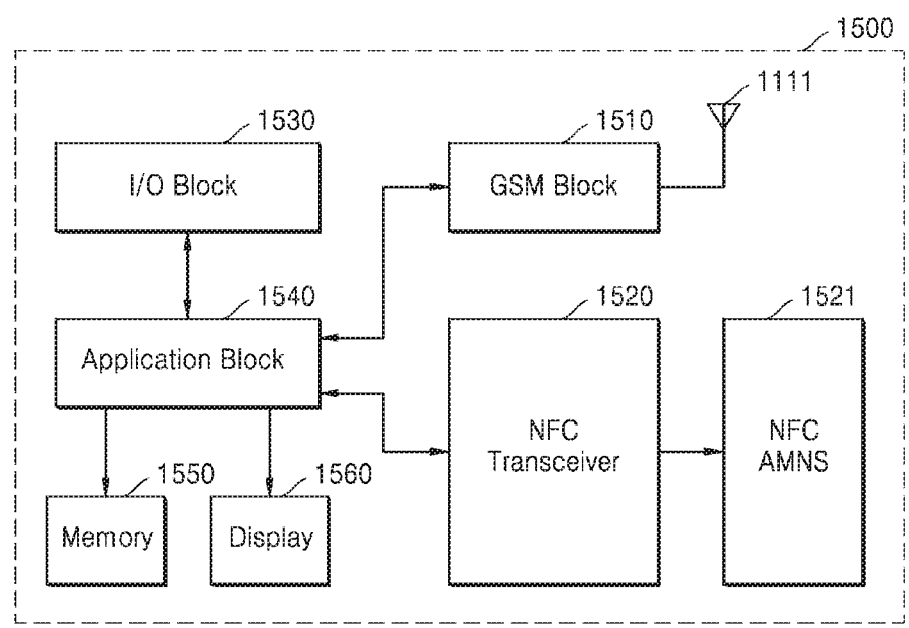
FIG. 15 is a block diagram of an example mobile device, to which a memory device having stepwise low power states is applied, according to embodiments of the inventive concept.

FIG. 15 is a block diagram of an example mobile device that includes a memory device having stepwise low power states, according to embodiments of the present disclosure. The mobile device may be a mobile phone or a smart phone.

Referring to FIG. 15, a mobile device 1500 includes a global system for mobile communication (GSM) block 1510, a near field communication (NFC) transceiver 1520, an input/output block 1530, an application block 1540, memory 1550, and a display 1560. In FIG. 15, the components/blocks of the mobile device 1500 are shown by way of example. The mobile device 1500 may include more components/blocks or less components/blocks. In addition, although GSM technology is shown as being used in this embodiment, the mobile device 1500 may be realized by using other technologies such as code division multiple access (CDMA).

The GSM block 1510 is connected to an antenna 1111, and may operate to provide wireless phone operations in a manner known in the art. The GSM block 1510 includes a receiver and a transmitter therein and thus may perform reception and transmission operations.

The NFC transceiver 1520 may be configured to transmit and receive NFC signals by using inductive coupling, for wireless communication. The NFC transceiver 1520 may provide the NFC signals to an NFC antenna matching network system 1521, and the NFC antenna matching network system 1521 may transmit the NFC signals by inductive coupling.

The application block 1540 may include hardware circuits, for example, one or more processors, and may operate to provide various user applications provided by the mobile device 1500. The user applications may include voice call operations, data transmission, data swap, and the like.

The display 1560 may display images in response to display signals received from the application block 1540. The images are provided by the application block 1540 or generated by a camera embedded in the mobile device 1500. The display 1560 may include a frame buffer therein for the temporary storage of pixel values, and may be configured as a display screen in conjunction with associated control circuits.

The input/output block 1530 provides an input function to a user and provides output to be received through the application block 1540.

The memory 1550 may store program (instructions) and/or data to be used by the application block 1540, and may be realized as RAM, ROM, flash memory, or the like. Thus, the memory 1550 may include volatile and non-volatile storage devices. For example, the memory 1550 may correspond to the non-volatile memory device 120 described with reference to FIGS. 1 to 14. In the memory 1550, a reclaim operation may be controlled based on selected read counts and/or non-selected read counts of individual strings of a selected memory block.

While the inventive concepts of the present disclosure have been particularly shown and described with reference to embodiments thereof, it will be understood that various changes in form and details may be made therein without departing from the spirit and scope of the following claims.

What is claimed is:

1. A method of operating a memory controller for controlling a non-volatile memory device, the method comprising:

transmitting, by the memory controller, a read command and a read address to the non-volatile memory device;

performing a read operation on memory cells connected to a selected word line in a selected string of a selected memory block of the non-volatile memory device, according to the read command and the read address;

counting a selected read count of the selected string in the selected memory block; and performing a reclaim operation to move data, stored in the selected memory block, to another memory block based on the selected read count.

2. The method of claim 1, wherein the selected string is selected by a string selection line from among a plurality of strings sharing a bit line in the selected memory block.

3. The method of claim 1, wherein the selected string is selected by a ground selection line from among a plurality of strings sharing a bit line in the selected memory block.

4. The method of claim 1, further comprising:
storing, for each of a plurality of strings sharing a bit line in the selected memory block, the selected read count in a latch, of a plurality of latches, corresponding to a corresponding string when the corresponding string is selected.

5. The method of claim 4, wherein the performing the reclaim operation comprises storing in a register a highest value among the selected read counts respectively stored in the latches,
wherein the reclaim operation is performed when the selected read counts stored in the register exceed a read threshold.

6. The method of claim 4, wherein the performing the reclaim operation further comprises summing up the selected read counts respectively stored in the latches to obtain a summed result,
wherein the reclaim operation is performed when the summed result exceeds a read threshold.

7. The method of claim 4, wherein a weight is applied to each of the selected read counts respectively stored in the latches, based on at least one of contents stored in the selected memory block, a reliability level of the selected memory block, multi-level levels of memory cells in the selected memory block, a number of program/erase times of the selected memory block, or a time during which the read operation of the selected memory block is performed.

8. A method of operating a memory controller for controlling a non-volatile memory device, the method comprising:
transmitting, by the memory controller, a read command and a read address to the non-volatile memory device;
performing a read operation on memory cells connected to a selected word line in a selected string of a selected memory block of the non-volatile memory device, according to the read command and the read address;
counting a non-selected read count of a non-selected string in the selected memory block; and
performing a reclaim operation to move data, stored in the selected memory block, to another memory block based on the non-selected read count.

9. The method of claim 8, wherein the selected string is selected by a string selection line, from among a plurality of strings sharing a bit line in the selected memory block.

10. The method of claim 8, wherein the selected string is selected by a ground selection line from among a plurality of strings sharing a bit line in the selected memory block.

11. The method of claim 8, further comprising:
storing, for each of a plurality of strings sharing a bit line in the selected memory block, the non-selected read count in a latch corresponding to a corresponding string when the corresponding string is not selected.

12. The method of claim 11, wherein a weight is applied to each of the non-selected read counts respectively stored in the latches, based on at least one of contents stored in the selected memory block, a reliability level of the selected memory block, multi-level levels of memory cells in the selected memory block, a number of program/erase times of the selected memory block, or a time during which the read operation of the selected memory block is performed.

13. The method of claim 8, wherein the counting the non-selected read count of the non-selected string comprises applying a weight to the non-selected read count of the non-selected string according to a position of the selected word line in the non-selected string.

14. A method of operating a memory controller for controlling a non-volatile memory device, the method comprising:
transmitting, by the memory controller, a read command and a read address to the non-volatile memory device;
performing a read operation on memory cells connected to a selected word line in a selected string of a selected memory block of the non-volatile memory device, according to the read command and the read address;
counting a selected read count of the selected string in the selected memory block;
counting a non-selected read count of a non-selected string in the selected memory block; and
performing a reclaim operation to move data, stored in the selected memory block, to another memory block when any one of the selected read count and the non-selected read count exceeds a read threshold.

15. The method of claim 1,
wherein the reclaim operation is such that data stored in the memory cells connected to the selected word line in the selected string of the selected memory block is stored in memory cells connected to another word line other than a selected word line of another memory block.

16. The method of claim 15,
wherein, by the reclaim operation, a page address of original data stored in strings of the selected memory block is changed to a page address of other strings of the other memory block.

17. The method of claim 15, further comprising:
storing, for each of a plurality of strings sharing a bit line in the selected memory block, the selected read count in a latch, of a plurality of latches in the memory controller, corresponding to a corresponding string when the corresponding string is selected.

18. The method of claim 17,
wherein the performing the reclaim operation comprises performing the reclaim operation when a difference between a minimum value and a maximum value of selected read counts respectively stored in the latches exceeds a dispersion threshold value.

19. The method of claim 17,
wherein the performing the reclaim operation comprises performing the reclaim operation when a difference between an average value and a maximum value of selected read counts respectively stored in the latches exceeds a dispersion threshold value.

20. The method of claim 14,
wherein the memory controller comprises a read controller and a reclaim controller;
wherein the read controller is configured to perform the read operation, the counting of the selected read count and of the non-selected read count, and
wherein the reclaim controller is configured to perform the reclaim operation.

* * * * *